United States Patent
Roldan Molinero et al.

(10) Patent No.: US 11,658,607 B2
(45) Date of Patent: May 23, 2023

(54) BUILDING-INTEGRATED PHOTOVOLTAIC APPARATUS, IN PARTICULAR FOR WINDOWS AND THE LIKE, A METHOD AND A SLAT FOR SAID APPARATUS

(71) Applicant: Scuola universitaria professionale della Svizzera italiana (SUPSI), Manno (CH)

(72) Inventors: Ruben Roldan Molinero, Lugano (CH); Francesco Frontini, Monza (IT)

(73) Assignee: SCUOLA UNIVERSITARIA PROFESSIONALE DELLA SVIZZERA ITALIANA (SUPSI), Manno (CH)

( * ) Notice: Subject to any disclaimer, the term of this patent is extended or adjusted under 35 U.S.C. 154(b) by 92 days.

(21) Appl. No.: 17/286,627

(22) PCT Filed: Oct. 17, 2018

(86) PCT No.: PCT/EP2018/078448
§ 371 (c)(1),
(2) Date: Apr. 19, 2021

(87) PCT Pub. No.: WO2020/078548
PCT Pub. Date: Apr. 23, 2020

(65) Prior Publication Data
US 2021/0367553 A1    Nov. 25, 2021

(51) Int. Cl.
*H02S 30/20* (2014.01)
*H01L 31/0463* (2014.01)
(Continued)

(52) U.S. Cl.
CPC ............ *H02S 30/20* (2014.12); *E06B 3/6722* (2013.01); *E06B 9/264* (2013.01); *E06B 9/32* (2013.01);
(Continued)

(58) Field of Classification Search
None
See application file for complete search history.

(56) References Cited

U.S. PATENT DOCUMENTS

| 4,137,098 A | 1/1979 | Field |
| 2007/0175599 A1 | 8/2007 | Froese |

(Continued)

FOREIGN PATENT DOCUMENTS

EP    252041 A2    1/1988

OTHER PUBLICATIONS

Junichi Ebisawa et al. "Solar control coating on glass", Amorphous materials, Current Opinion in Solid State & Materials Science, 1998, vol. 3, Issue 4, pp. 386-390.
(Continued)

*Primary Examiner* — Daniel P Malley, Jr.
(74) *Attorney, Agent, or Firm* — Cantor Colburn LLP

(57) ABSTRACT

An integrated building photovoltaic apparatus for closing an opening on a building facade and generating electricity from a solar radiation which pass through the opening,
includes at least two panes that are at least partially transparent and joined to each other by an interposed spacer to form an internal chamber therebetween;
a blind arranged inside the internal chamber and having movable photovoltaic slats to vary the amount of the solar radiation passing through the opening; and
connection elements, configured to pull or push the photovoltaic slats. Each slat has a photovoltaic sheet with interconnection grooves which define thin film solar cells monolithically connected in series.
The solar cells include at least two coupling thin film solar cells (40'), each one
having a through hole and
(Continued)

a close-pattern isolation groove surrounding the through hole to define an inactive area of the coupling single thin film solar cell surrounding the through hole.

16 Claims, 9 Drawing Sheets

(51) Int. Cl.
    *H01L 31/0465*     (2014.01)
    *H02S 40/36*     (2014.01)
    *E06B 3/67*     (2006.01)
    *E06B 9/264*     (2006.01)
    *E06B 9/32*     (2006.01)
    *E06B 9/386*     (2006.01)
    *H01L 31/02*     (2006.01)
    *E06B 9/24*     (2006.01)

(52) U.S. Cl.
    CPC ........ *E06B 9/386* (2013.01); *H01L 31/02008* (2013.01); *H01L 31/0463* (2014.12); *H01L 31/0465* (2014.12); *H02S 40/36* (2014.12); *E06B 2009/2476* (2013.01)

(56) References Cited

U.S. PATENT DOCUMENTS

| | | | |
|---|---|---|---|
| 2008/0216966 A1* | 9/2008 | Ben-David | E06B 9/264 160/167 R |
| 2011/0126992 A1* | 6/2011 | Yordanova | H02S 20/30 160/405 |
| 2012/0031018 A1* | 2/2012 | Kapany | F24S 20/63 136/246 |
| 2012/0152469 A1* | 6/2012 | Choi | H02S 40/38 320/101 |
| 2015/0101761 A1* | 4/2015 | Moslehi | E06B 9/386 160/107 |
| 2018/0030781 A1* | 2/2018 | Hall | H02S 30/10 |
| 2018/0076762 A1* | 3/2018 | Hall | H02S 30/20 |
| 2018/0171702 A1* | 6/2018 | Hall | E06B 3/6722 |
| 2018/0195766 A1 | 7/2018 | Cheun et al. | |
| 2018/0204967 A1* | 7/2018 | Hall | H01L 31/048 |
| 2020/0080369 A1* | 3/2020 | Achiel | E06B 9/32 |
| 2020/0185554 A1* | 6/2020 | Choi | E06B 9/386 |
| 2020/0228055 A1* | 7/2020 | Choi | E06B 9/303 |

OTHER PUBLICATIONS

Daniel Gfeller et al. "Testing of Smart PV Modules", 332nd European Photovoltaic Solar Energy Conference and Exhibition, 2016, pp. 2130-2134.

R. Bruendlinger et al. "Module Integrated Power Converters—A Comparison of State-Of-The-Art Concepts and Performance Test Results", 26th European Photovoltaic Solar Energy Conference and Exhibition, 2011, pp. 3204-3211.

Raul J. Martín-Palma "Spectrally selective coatings on glass: solar-control and low-emissivity coatings" Journal of Nanophotonics, Sep. 2009, vol. 3, Mar. 3, 2005 pp. 1-4, https://www.researchgate.net/publication/244651020.

* cited by examiner

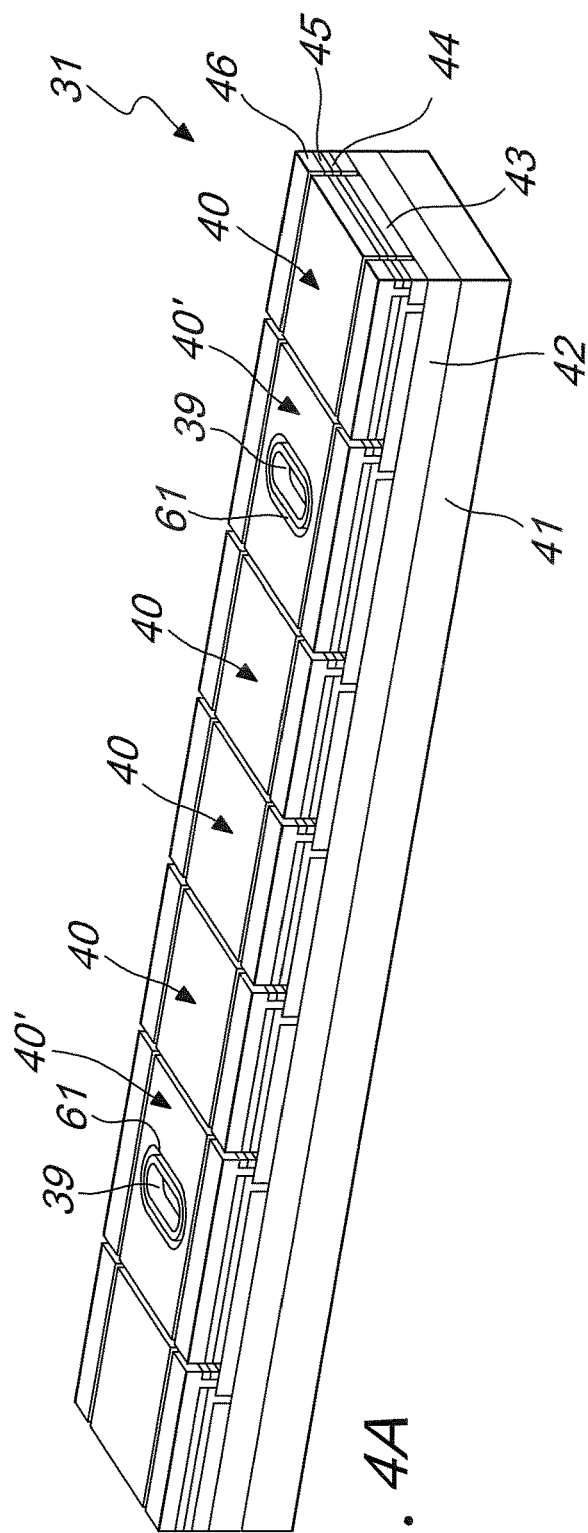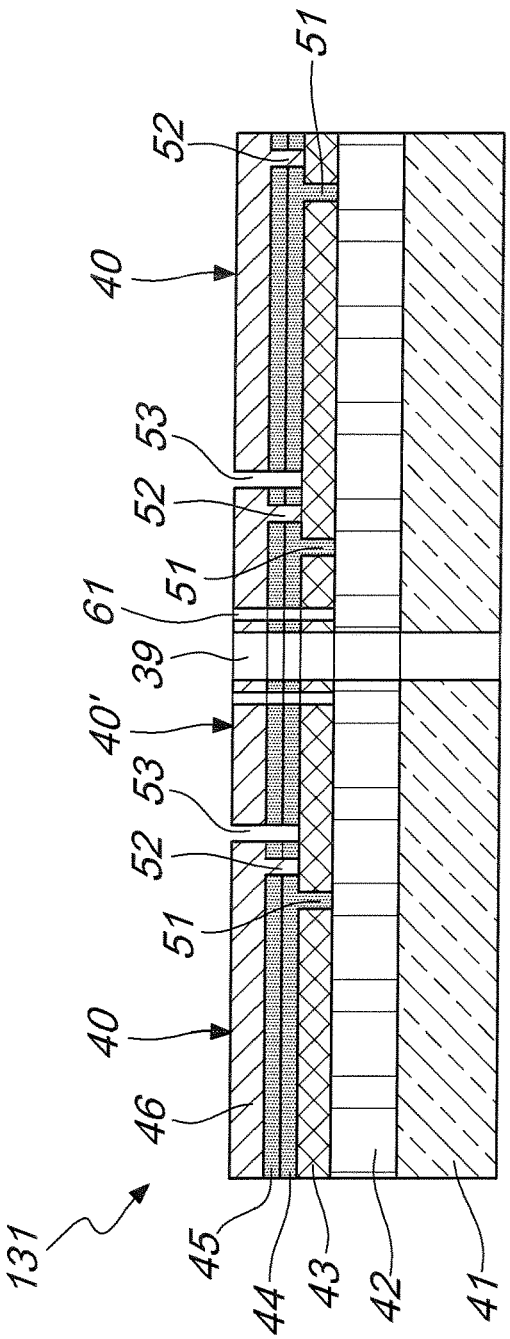

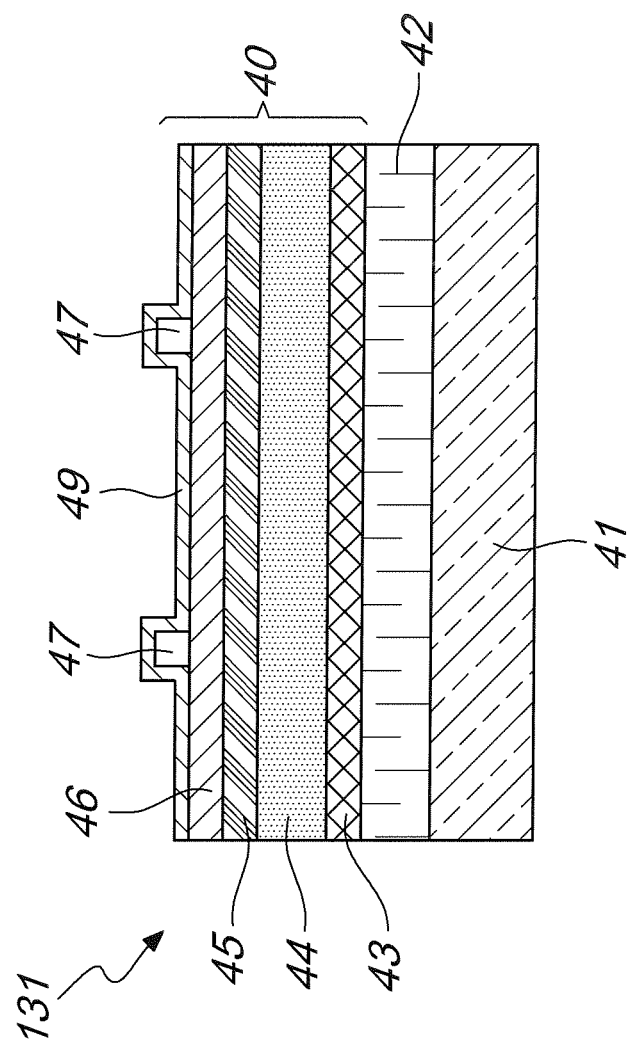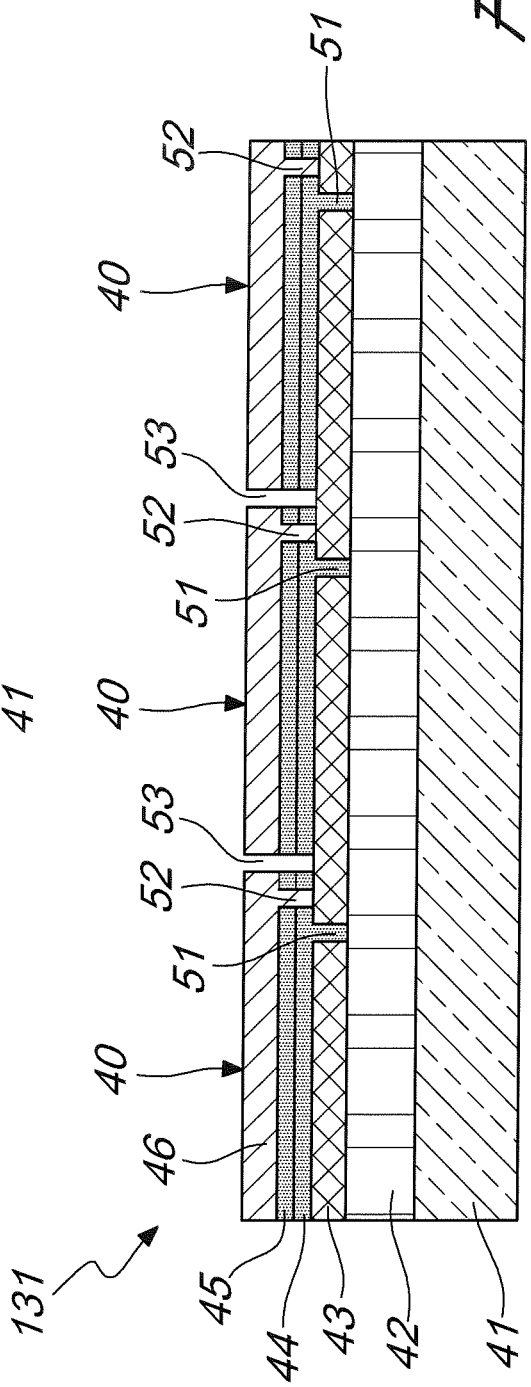

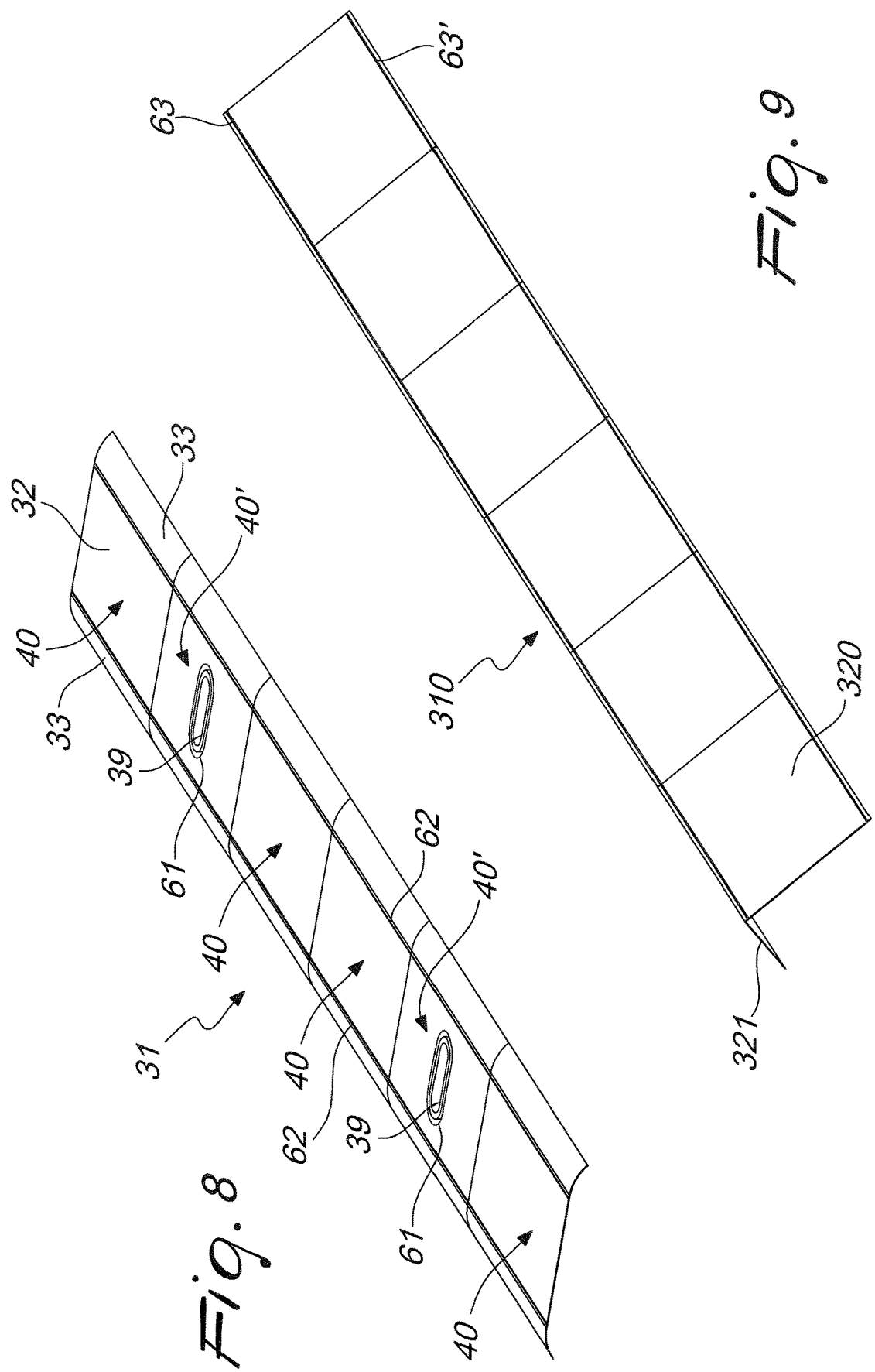

BUILDING-INTEGRATED PHOTOVOLTAIC APPARATUS, IN PARTICULAR FOR WINDOWS AND THE LIKE, A METHOD AND A SLAT FOR SAID APPARATUS

TECHNICAL FIELD

The present disclosure relates to a building-integrated photovoltaic (BIPV) apparatus, and more precisely to an apparatus of the kind suitable for closing an opening on a facade of a building and generating electricity from a solar radiation which pass through the opening such as, for example, the building-integrated photovoltaic (BIPV) devices known as "photovoltaic blind windows".

BACKGROUND

The expression "building-integrated photovoltaic (BIPV)" is commonly referred to photovoltaic materials that are used to replace conventional building materials in parts of the building envelope such as the roof, skylights, or facades. They are increasingly being incorporated into the construction of new buildings as a principal or ancillary source of electrical power, although existing buildings may be retrofitted with similar technology.

In particular, the apparatus to which reference is made is an apparatus which can replace conventional windows (or glasses or skylights or the like) and the conventional blinds, such as venetian blind.

Over the course of time, photovoltaic windows that can be used to replace conventional windows (or glasses or skylights or the like), producing at the same time electric energy, have been developed.

A solution of this type is shown in the U.S. Pat. No. 4,137,098 which describes an energy absorbing venetian blind type device for generating electricity, providing heat and serving as a sun shade. A plurality of slats covered with an array of photovoltaic cells are enclosed between two panes of glass of a window housing. A heat removal system using forced air cools the photovoltaic cells and collect heat for heating purposes elsewhere. The electricity generated by the photovoltaic cells is collected for immediate use or stored in storage batteries for later use.

Another example is shown in the patent application EP252041A which describes a photovoltaic blind window having photovoltaic cells applied to an electric blind arranged between two pane of glass.

In practice, in these windows structures, as well as in the other known photovoltaic windows, the apparatus comprises a traditional venetian blind comprising a plurality of slats, normally made of plastic material, on which are fixed, in a second time, photovoltaic cells of the crystalline silicon type. The photovoltaic cells are then connected each other by means of an additional wiring which need to be arranged in the windows structure in such a way to not interfere with the movement of the blind.

Although functional, these known apparatus has limitations, especially regarding handling, production speed and features such as flexibility and form factor. The complete fabrication process involves several separate steps to prepare and process cells and circuit assemblies before a photovoltaic slat is complete. By using the crystalline silicon technology, individual cells must be sorted and wired together and assembled into the photovoltaic circuit that must be carefully placed and positioned prior to the lamination process and final assembly. The complexity of this manufacturing process strongly influences the market price of the device. Furthermore, the size of such assembly tend to be too large to be inside in a glass enclosed chamber with an easy installation framing structure suitable to retrofit conventional insulated windows.

Further, in known photovoltaic windows, the wavelength ranges of the solar spectrum that are not converted into electric current rises the temperature of the blind at relatively high temperature, in certain cases also above 90° C. Consequently, the components in the sealed glass-enclosed chamber release vapors that condense on the cooler surfaces and compromise the system reliability.

SUMMARY

The aim of the present disclosure is to solve the technical problem described above, obviates the drawbacks and overcomes the limitations of the background art, providing a building-integrated photovoltaic apparatus of the type cited above which have a more compact structure with dimension which can be smaller than the prior art.

Within the scope of this aim, the present disclosure provides a building-integrated photovoltaic apparatus that is more flexible and versatile in the design with respect to the prior art.

Moreover, the present disclosure provides a building-integrated photovoltaic apparatus having an assembly easier with respect to the prior art.

The present disclosure also provides an alternative to known solutions.

The present disclosure provides a building-integrated photovoltaic apparatus that requires less maintenance.

This aim, these advantages and others which will become better apparent hereinafter are achieved by providing an integrated building photovoltaic apparatus, suitable for closing an opening on a facade of a building and generating electricity from a solar radiation which pass through said opening, comprising:

a first and a second pane both at least partially transparent, which are joined to each other by means of an interposed spacer so as to form an internal chamber between them, a blind arranged inside said internal chamber and comprising a plurality of movable slats which comprise at least one photovoltaic slat and which can be moved to vary the amount of the solar radiation passing through the opening;

connection elements, configured to pull or push said slats so as to make them translate along a first axis that is parallel to said panes and/or to rotate around second axes which are also parallel to said panes and perpendicular to said first axis;

characterized in that said at least one photovoltaic slat comprises a photovoltaic sheet comprising: a substrate, at least one insulating layer arranged on said substrate, a back contact layer arranged on said at least one insulating layer, a plurality of junction layers arranged on said back contact layer and at least a front contact layer arranged on said plurality of junction layers, the photovoltaic sheet comprising interconnection grooves which define in the photovoltaic sheet a plurality of thin film solar cells monolithically connected each other in series, said plurality of thin film solar cells comprising at least two coupling thin film solar cells, each one of which comprises:

a through hole passing through the substrate, the at least one insulating layer, the back contact layer, the plurality of junction layers and the at least one front contact layer and a close-pattern isolation groove surrounding the through hole and extending at least through said front contact layer, said plurality of junction layers and said back contact layer so as to define an inactive area of said coupling thin film solar cell surrounding the through hole;
said connection elements comprising first connection elements passing through said through holes.

This aim and these advantages are also achieved by providing a method according to claim 13.

This aim and these advantages are also achieved by providing a use according to claim 16.

This aim and these advantages are also achieved by providing a slat according to claim 17.

BRIEF DESCRIPTION OF THE DRAWINGS

Further characteristics and advantages will become better apparent from the description of a preferred but not exclusive embodiment of a building-integrated photovoltaic apparatus, illustrated by way of nonlimiting example with the aid of the accompanying drawings, wherein:

FIG. 4A is a schematic representation of the structure of a photovoltaic slat according to the disclosure;

FIG. 4B is vertical section of part of the photovoltaic slat of FIG. 4A;

FIG. 6 is a schematic cross section of part of a possible embodiment of a photovoltaic sheet;

FIG. 7 is a schematic cross section of part of a possible embodiment of a photovoltaic sheet, wherein a plurality of thin film solar cells monolithically connected each other in series are defined;

FIG. 8 is a prospective view of a first possible embodiment of a photovolatic slat according to the disclosure;

FIG. 9 is a prospective view of a second possible embodiment of a photovoltaic slat according to the disclosure;

DETAILED DESCRIPTION OF THE DRAWINGS

Figure 1:
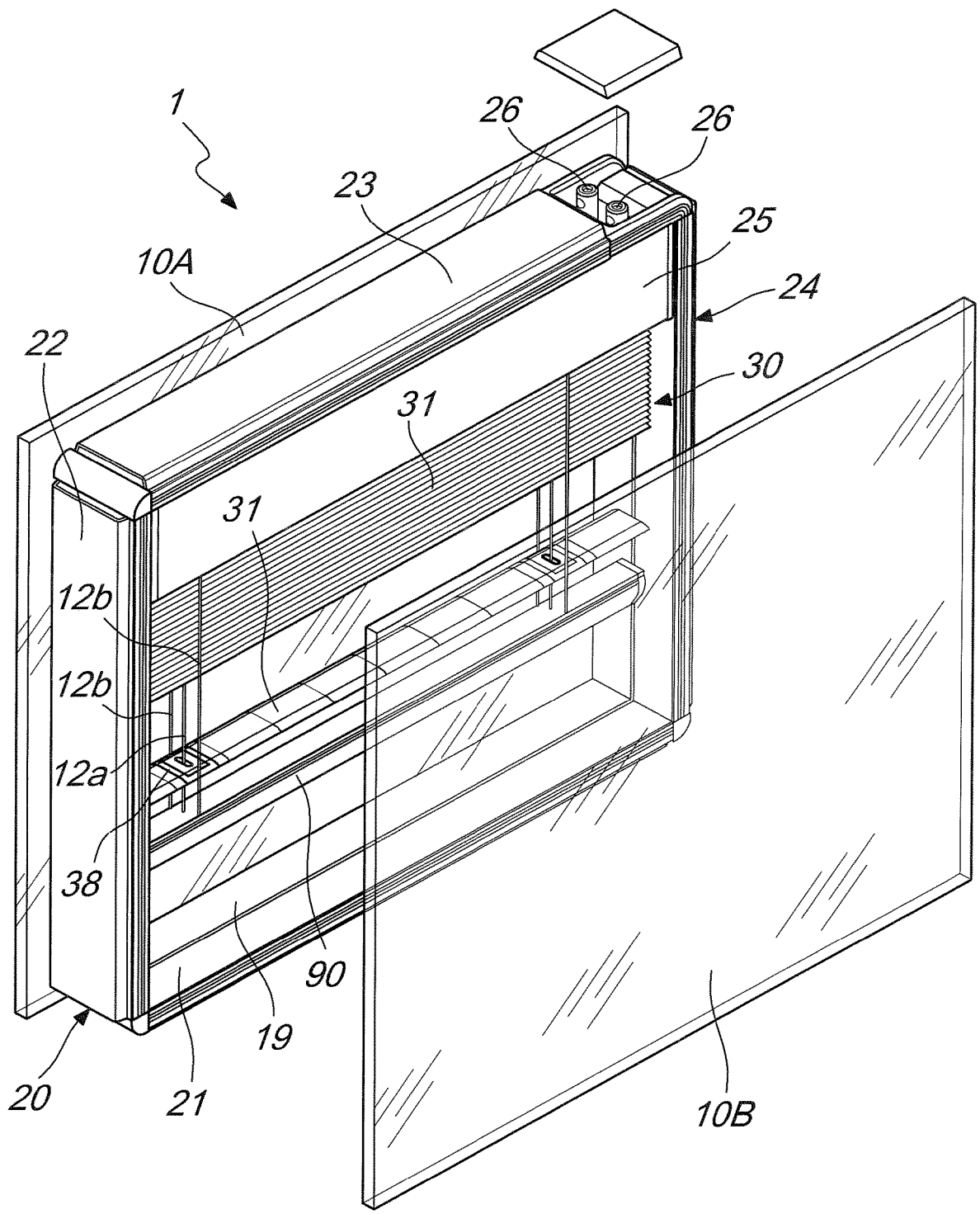
FIG. 1 is an exploded view of part of a first embodiment of a building-integrated photovoltaic apparatus, according to the disclosure.

Before delving into the detailed description, it should be noted that the accompanying figures show parts of a building-integrated photovoltaic apparatus according to the disclosure which, for the sake of clarity, have some parts removed (e.g. the motor, the converter) since these parts, in addition to being known by the person skilled in the art, are not useful for the comprehension of the disclosure itself and would only contribute to an overall crowding of the figures. Furthermore, in particular in figures from 4 to 7, the drawings as to be intended as schematic, since them do not reflect the exact proportions, in order to better show the underlying structure of the layers.

With reference to the cited figures, the a building-integrated photovoltaic apparatus, designated generally by the reference numeral 1, is suitable and configured for closing an opening on a facade of a building (typically a window) and generating electricity from a solar radiation (i.e. the solar light) which pass through the opening.

The apparatus 1 can also be installed in structures different than a building, for example in the windows of ships or caravans.

In some embodiments the apparatus 1 can replace a whole conventional window structure, in other embodiments it can replace just a part of a conventional windows structure (i.e. the glass) or retrofit a pre-existing window.

The apparatus 1 comprises a first 10A and a second 10B pane both at least partially transparent or translucent, which are joined to each other by means of an interposed spacer 20 so as to form an internal chamber 19 between them. In certain embodiments the spacer 20 is part of the frame or is the same frame.

Preferably, the panes 10A, 10B are made of glass, or acrylic glass, or any other material transparent to the visible light.

Preferably, the internal chamber 19 is sealed, by means of suitable sealing material displaced along the perimeter of the panes 10A, 10B, so as to be hermetically insulated; in that way the internal chamber 19 is protected against contaminants such as dust, dirt, and debris by the sealing material, which runs along the outer perimeter.

In some embodiments, the internal chamber is filled with a gas, preferably a thermal-insulation gas, more preferably a gas mixture comprising 90% Argon and 10% air, in order to improve the thermal insulation provided by the apparatus.

In other embodiments, inside the internal chamber 19 it is generated vacuum so as to reduce the heat transfer across the chamber 19.

Inside the internal chamber 19 a blind 30 is arranged which acts as a sun shade.

The blind 30 comprises a plurality of movable slats comprising at least one and preferably a plurality of photovoltaic slats 31. The movable slats, in a known way, can be moved to vary the intensity of the solar radiation passing through the opening (i.e the opening on the facade of the building), by opening, adjusting or closing the blind 30.

In the illustrated embodiment all the movable slats are photovoltaic slats 31, in another embodiment only one of the movable slats is a photovoltaic slat 31, in other possible embodiments just some movable slats are photovoltaic slats 31.

In greater detail, the blind 30 comprises connection elements 12a, 12b configured to pull or push the slats 31 so as to make them translate along a first axis that is parallel to the panes 10A, 10B (a vertical axis in the illustrated examples) and/or rotate (preferably simultaneously) around second axes which are also parallel to panes 10A, 10B and perpendicular to the first axis (around horizontal axes in the illustrated examples). In the preferred embodiments, the connection elements 12a, 12b comprises strips or cords which will be described in greater detail hereinafter.

According to the disclosure, each photovoltaic slat 31 comprises a photovoltaic sheet 131.

With particular reference to FIGS. 6 and 7, the photovoltaic sheet 131, in turn, comprises: a substrate 41, at least one insulating layer 42 arranged on the substrate 41, a back contact layer 43 arranged on the at least one insulating layer 42, a plurality of junction layers 44, 45 arranged on the back contact layer 43 and at least a front contact layer 46 arranged on that plurality of junction layers 44, 45.

Preferably, the substrate 41 is a flexible substrate and even more preferably is metallic, for instance made of aluminum (Al) or stainless steel (SS) or titanium (Ti) or magnesium (Mg).

The insulating layer 42 is preferably made of oxides of silicon (SiOx) or alumina (Al2O3) or polyamide and it is interposed between the substrate 41 and the overlying layers (i.e. the back contact layer 43, 44, the junction layers 44, 45 and the front contact layer 46) which are active, so as to avoid electric contact between the substrate 41 and the overlying active layers 43, 44, 45, 46.

Optionally, the photovoltaic sheet 131 further comprises a second insulating layer (not illustrated), arranged on the other side of the substrate 41 (i.e. the substrate's surface opposite with respect to the surface on which the above mentioned back contact layer 43 and the junction layers 44, 45 are deposed), in order to prevent possible short-circuits when the photovoltaic slats are in contact, for example during the rising or the lowering of the blind.

The back contact layer 43 is preferably a back metal contact layer, and even more preferably is made of molybdenum (Mo), deposited on the insulating layer 42.

The junction layers 44, 45 are preferably made of well known semiconductors of p-type and n-type so to realize p-n junctions.

The at least one front contact layer 46 preferably comprises a transparent conducting oxide layer (TCO), such as a layer of aluminium doped zinc oxide (ZnO:Al), for collecting and transporting the photo-generated charge carries.

Optionally, the at least one front contact layer 46 is provided with a metal contact grid 47, for example arranged above the transparent conducting oxide layer, to transport the electric current more efficiently.

Optionally, a PET, or EVA or any other plastic foil 49 laminating the photovoltaic sheet is arranged above the at least one front contact layer 46 to provide protection from possible damages or contaminants during handling and processing. In the example shown in FIG. 6, a plastic foil 49 is arranged on the top surface of the photovoltaic sheet 131 so as to cover the front contact layer 46 and the contact grid 47.

The photovoltaic sheet 131 further comprises interconnection grooves 51, 52, 53 (or scribing steps) which define in the photovoltaic sheet 131 a plurality of thin film solar cells 40, 40' monolithically connected each other in series.

Diverse structures of thin film solar cells monolithically connected each other in series are well-known in the photovoltaic technologies field. The skilled person can thus realize a photovoltaic sheet 131 comprising interconnection grooves 51, 52, 53 which define in the photovoltaic sheet 131 a plurality of thin film solar cells 40, 40' monolithically connected each other in series, according to state of the art.

In some embodiments the plurality of thin film solar cells 40, 40' comprises single junction thin film solar cells 40, 40' monolithically connected, in other embodiments the plurality of thin film solar cells 40, 40' comprises multi junction thin film solar cells monolithically connected.

As known, the multi junction concept is the most relevant approach to overcome the thermodynamic limit for single junction thin film solar cells.

Multi junction thin film solar cells monolithically connected are semiconductor devices with multiple p-n (or p-i-n in case of amorphous silicon) junctions. The most usual structures include stacking two (tandem) or even three (triple) junction on top of each other. Multi junction structures such as a-Si:H/SiGe:H/uc-Si:H from UniSolar, a-Si:H/uc-Si:H from Kaneka are very well known in the market.

However, different novel photovoltaic technologies have been intensively developed and hybrid tandem solar cells such as perovskite/c-Si tandem, perovskite/CIGS tandem and a-Si:H/organic double- and triple junctions have all demonstrated the potential of exceeding the efficiency of the component single junction cells.

In the illustrated and not limiting example, in particular with reference to the single junction CIGS solar cell structure depicted in FIG. 6, the junction layers 44, 45 comprise:

a first junction layer 44, namely an absorber layer, made of a semiconductor of the p-type, preferably a deposition of Cu(In,Ga)Se2, deposited on the back metal contact layer 43 and a second junction layer 45, namely a buffer layer, made of a semiconductor of the n-type, preferably a layer of cadmium sulfide CdS, deposited on the absorber layer layer 44.

In certain embodiments (not shown), between the junction layers 44, 45 and the at least one front contact layer 46 (e.g. between the buffer layer 45 and the transparent conducting oxide layer) an intrinsic zinc oxide (i-ZnO) layer is further provided to protect the underlying junction layer 45 from sputter damage in the subsequent step of the fabrication process, where the least one front contact layer 46 (e.g. a transparent conducting oxide (TCO)) is sputtered on top of the intrinsic zinc oxide (i-ZnO) layer.

A possible configuration of the interconnection grooves 51, 52, 53 is shown in FIG. 7, still related to the not limiting example of the single junction CIGS solar cell structure. In greater detail, in this example, the interconnection grooves 51, 52, 53 comprise:

first interconnection grooves 51 extending through the back contact layer 43 and which are filled by the first junction layer 44 (i.e. the absorber layer);

second interconnection grooves 52 extending through the first junction layer 44 (i.e. the absorber layer) and the second junction layer 45 (i.e. the buffer layer) and filled by the front contact layer 46 (i.e. the transparent conducting oxide layer);

third interconnection grooves 53 extending through the front contact layer 46 (i.e. the transparent conducting oxide layer), the second junction layer 45 and the first junction layer 44 and remaining empty (i.e. unfilled with further material).

As can be understood by looking at the figures, the first interconnection grooves 51 are substantially parallel and not coincident with respect to the second interconnection grooves 52 which, in turn, are substantially parallel and not coincident with respect to the third interconnection grooves 53; in other words the grooves 51, 52, 53 have a certain offset.

In this way, the first junction layer 44 extends into the first grooves 51 and is in contact with the insulating layer 42, and the front contact layer 46 extends into the second grooves 52 and is in contact with the back contact layer 43.

Preferably, the interconnection grooves 51, 52, 53 are provided by laser scribing. Alternatively, other patterning techniques for forming the interconnection grooves 51, 52, 53 can be used, for instance: silkscreening with resist masks, etching with positive or negative photoresists, mechanical scribing, electrical discharge scribing.

According to the disclosure, as shown for instance in FIGS. 4A and 4B, the plurality of thin film solar cells 40, 40' comprises at least two coupling thin film solar cells 40'. The coupling thin film solar cells 40' are, in practice, the solar cells aimed to be eventually connected to other photovoltaic slats 31; for this purpose, each one of the coupling thin film solar cells 40' comprises a through hole 39 passing through the substrate 41, the at least one insulating layer 42, the back contact layer 43, the plurality of junction layers 44, 45 and the at least one front contact layer 46; in other words, the through hole 39 passes through the whole photovoltaic slat 31.

Each coupling thin film solar cell 40' further comprises a close-pattern isolation groove 61 surrounding the through hole 39 and extending at least through the front contact layer 46, the plurality of junction layers 44, 45 and the back contact layer 43, so as to define an inactive area of the coupling thin film solar cell 40' surrounding the through hole 39.

The inactive area is, in practice, electrically isolated from the rest of the coupling thin film solar cell 40'.

Getting back to the structure of the whole apparatus 1, the connection elements 12a, 12b comprise first connection elements 12a which pass through the through holes 39 and preferably also second connection elements 12b linked to the photovoltaic slats 31 (preferably to the border of the photovoltaic slats 31). In practice, the connection elements 12a, 12b provide the mechanical connection of the photovoltaic slats 31; in the preferred embodiments at least part of the connection elements 12a, 12b provide also the electrical connection of the photovoltaic slats 31 by means of connection devices which electrically connect that part of the connection elements 12a, 12b (preferably the second connection elements 12b) with the active area of the coupling thin film solar cell 40'. Examples of suitable connection devices will be described in greater detail hereinafter.

Figure 11:
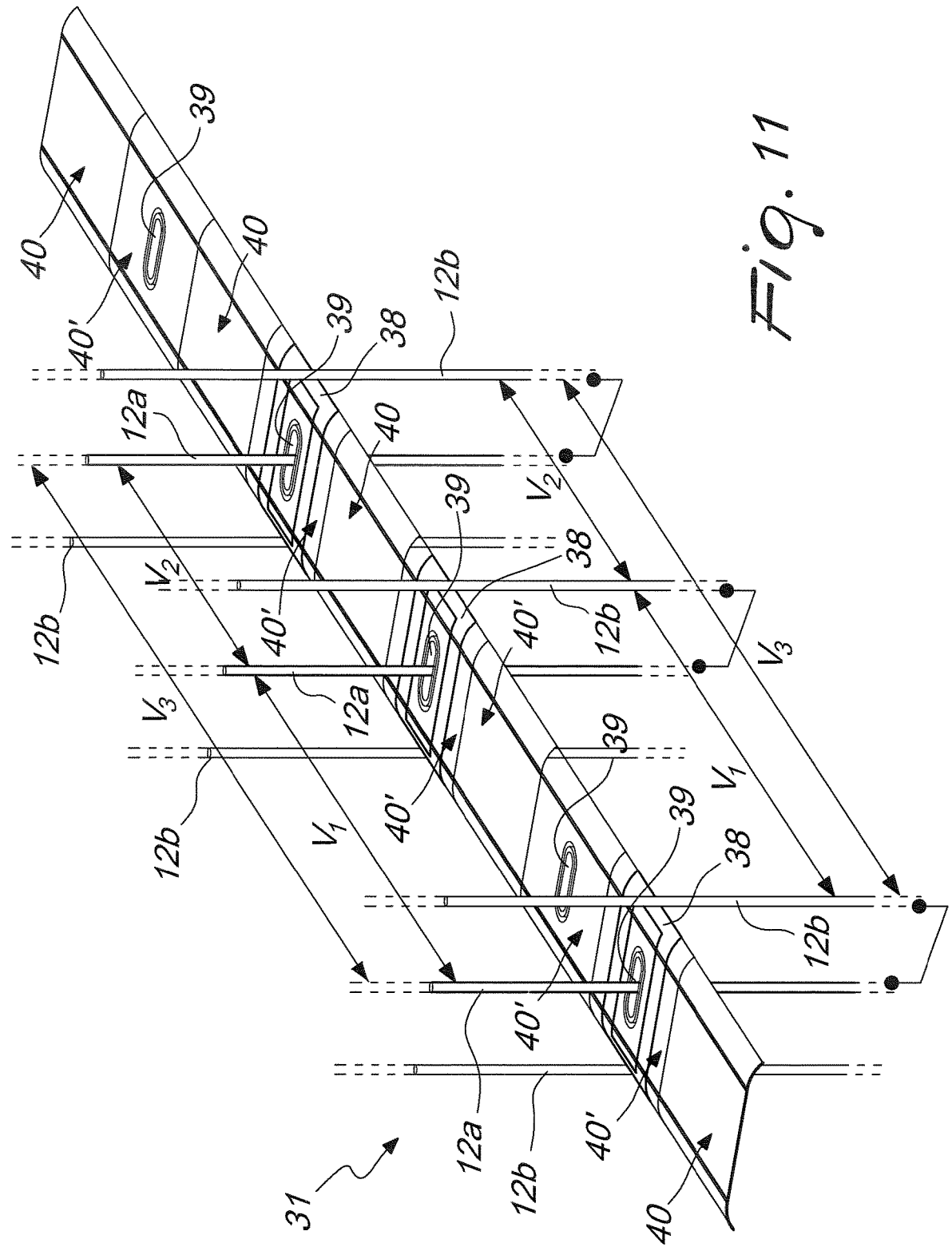
FIG. 11 is a prospective view of a further possible embodiment of a photovoltaic slat according to the disclosure, in connection with the connection elements.

At this point it is helpful to specify that the first connection elements 12a do not necessarily pass through every through hole 39: in some embodiments there are more than two through holes 39 and only some of them are engaged by the first connection elements 12a (see for instance FIG. 11).

In the preferred embodiments, the photovoltaic slats 31 comprise also one or more peripheral isolation grooves 62, 63, 63' extending at least through the front contact layer 46, the plurality of junction layers 44, 45 and the back contact layer 43 so as to define one or more peripheral inactive areas 33, 320 of the photovoltaic slat 31, 310.

The peripheral inactive areas 33, 320, similarly to the inactive areas defined by the close-pattern isolation grooves 61, are electrically isolated from the rest of the photovoltaic slat 31, 310 (i.e. from the rest of the photovoltaic sheet 131).

In practice, these peripheral isolation grooves 62, 63, 63' as well as the close-pattern isolation groove 61, isolate inactive areas 33, 320 protecting the thin film solar cells 40, 40' from significant defects like cracking, micro-cracking, lifting of film and/or shunting generated during any mechanical or optical cutting or drilling process and which might lead to an important electrical power-loss of the photovoltaic slats 31.

In certain embodiments, the peripheral inactive areas 33, 320 comprise at least one bent portion 33 and the photovoltaic slats 31 comprise a flat portion 32 placed adjacent to the at least one bent portion 33; in these embodiments peripheral isolation grooves 62 are realized between the bent portion 33 and the flat portion 32.

FIG. 8 shows a first possible embodiment of the photovoltaic slats 31. In this embodiment, the peripheral inactive areas 33, 320 comprise two bent portion 33 and the photovoltaic slat 31 comprises a central flat portion 32 placed between the two bent portions 33; as can be understood looking at the figure, the peripheral isolation grooves 62 are realized between each of the bent portions 33 and the central flat portion 32.

In greater detail, still in the embodiment shown in FIG. 8, the photovoltaic slats 31 are preferably 16 mm wide and less than 600 μm thick and comprise a central flat portion 32 between two longitudinally extending bent portions 33 that increase its resistance to deflection. It has to be noted that the peripheral isolation grooves 62, realized between each of the bent portions 33 and the central flat portion 32, render inactive the bent portions 33 of the photovoltaic slats 31.

FIG. 9 shows a second possible embodiment of the photovoltaic slats 310. In this embodiment, the peripheral inactive areas 33, 320 comprise an inactive flat face 320 and the photovoltaic slat 310 comprises an active flat face 321. The inactive flat face 320 and the active flat face 321 are connected along a longitudinal edge; as can be understood looking at the figure, one peripheral isolation groove 63 is realized along that longitudinal edge.

In greater details, in the embodiment shown in FIG. 9, the photovoltaic slats 310 comprise two flat faces 320, 321 connected along a longitudinal edge; on the inactive flat face 320 the active layers (i.e. the back contact layer 43, 44, the junction layers 44, 45 and the front contact layer 46) are erased, by techniques such as sand blasting or laser edge deletion, in such a way that the solar radiation is at least partially reflected by this inactive flat face 320. In practice, in this embodiment, the slats 310 have L-shape or V-shape cross section.

Thanks the fact that one face of the slats 310 (namely the inactive flat face 320) reflects the solar radiation, the temperature inside the internal chamber 19 can be advantageously reduced.

In the preferred embodiment, the blind 30 is of the venetian type wherein the photovoltaic slats 31 are arranged horizontally, parallel to each other, and are suspended by means of the connection elements 12a, 12b which comprise strips or cords. In this embodiment, the first connection elements 12a (comprising cords or strips) pass through the through holes 39 so as to pull at least a distal photovoltaic slat 31 (i.e. the last slat placed in the lowest position) which in turn pushes the others.

In this embodiment, as in the known venetian blinds, the blind 30 preferably comprises a bottom rail 90 arranged below all the slats and to which the lower end of the first 12a and the second 12b connection elements are fixed.

Figures 3A, 3B, 3C:
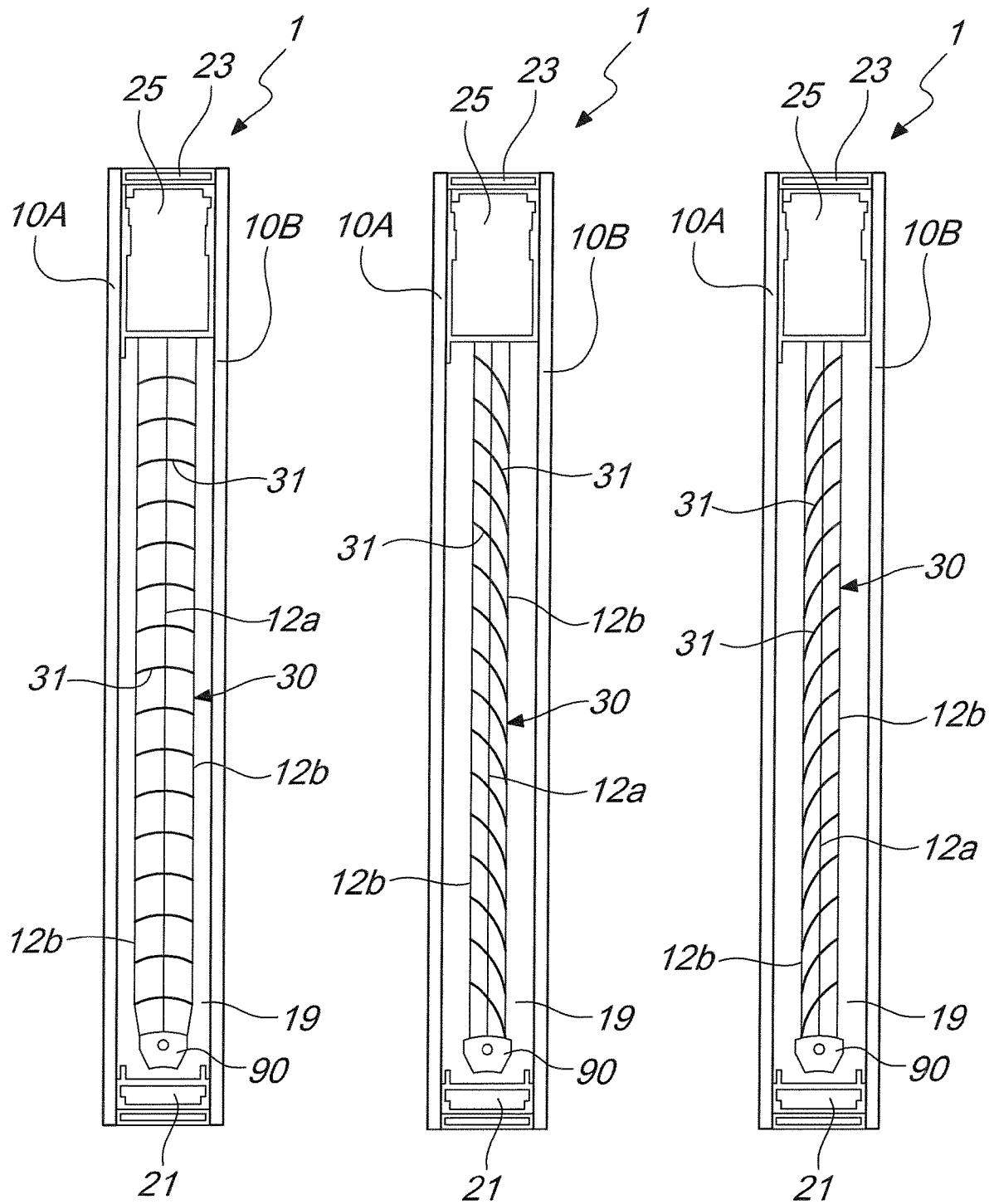
FIGS. 3A, 3B, and 3C are sectional side views of the apparatus of FIG. 1 with the slats rotated in different positions.

FIGS. 3A, 3B, and 3C show how the photovoltaic slats 31 are connected at least by three connection elements 12a, 12b (namely by at least one first connection element 12a and two second connection elements) and how the slats 31 can be simultaneously rotated from a first position (FIG. 3A) wherein the photovoltaic slats 31 are substantially parallel to the ground, to a second and to a third position (FIGS. 3B and 3C) wherein the photovoltaic slats 31 are inclined so as to close at least partially the blind and so reduce the light intensity passing through.

Furthermore, preferably, the photovoltaic slats 31 can be packed/unpacked in a raised or lowered condition by means of the connection elements 12a, 12b.

As said, preferably, the connection elements 12a, 12b comprise first connection elements 12a and second connection elements 12b, and more preferably at least:

two or more first connection elements 12a, such as elevation cords, which pass through the through holes 39, which operate the photovoltaic slats 31 in a linear (preferably vertical) movement (to pack/unpack the slats in a raised/lowered condition) and to which each photovoltaic slat 31 is rotatably coupled (i.e. coupled in such a way that the slat can rotate with respect to the first connection elements 12a), preferably about an horizontal rotation axis two or more second connection elements 12b, such as orientation cords, coupled at least with one photovoltaic slat 31, configured for imparting to said photovoltaic slat 31 a rotation around the rotation axis defined by the coupling with the first connection elements 12a.

The structure and the operation of the blinds of the venetian type are well known in the art and therefore do not need further descriptions.

In other embodiments (not shown), the slats are arranged differently, for example being rotatable around vertical axes and movable along the horizontal axis running along a track at the top of the blind 30. Depending on the embodiment, the blind 30 either open from side to side, or by parting in the middle.

In some embodiments the blind 30 comprises also slats of different type (e.g. not-photovoltaic slats). For example, in the blind 30, the photovoltaic slats 31 can be alternate with not-photovoltaic slats or a certain number of slats on one end of the blind 30 can be not-photovoltaic slats. In any case, the mechanical structure and mechanical operation of the blind 30 are substantially the same and the mechanical connections described with reference to the photovoltaic slats 31 apply also to the not-photovoltaic slats.

Preferably, the connection elements 12a, 12b comprise electrically conductive material and are configured to electrically and mechanically connect the photovoltaic slats 31: in other words, the connection elements 12a, 12b provide the mechanical connection together with the electrical connection of the photovoltaic slats 31. For this purpose, at least part of the connection elements 12a, 12b (preferably the second connection elements 12b) are electrically connected to the coupling thin film solar cells 40' by means of electrical connection device (preferably each second connection element 12b to a respective coupling thin film solar cells 40' for each photovoltaic slat 31).

Figure 10:
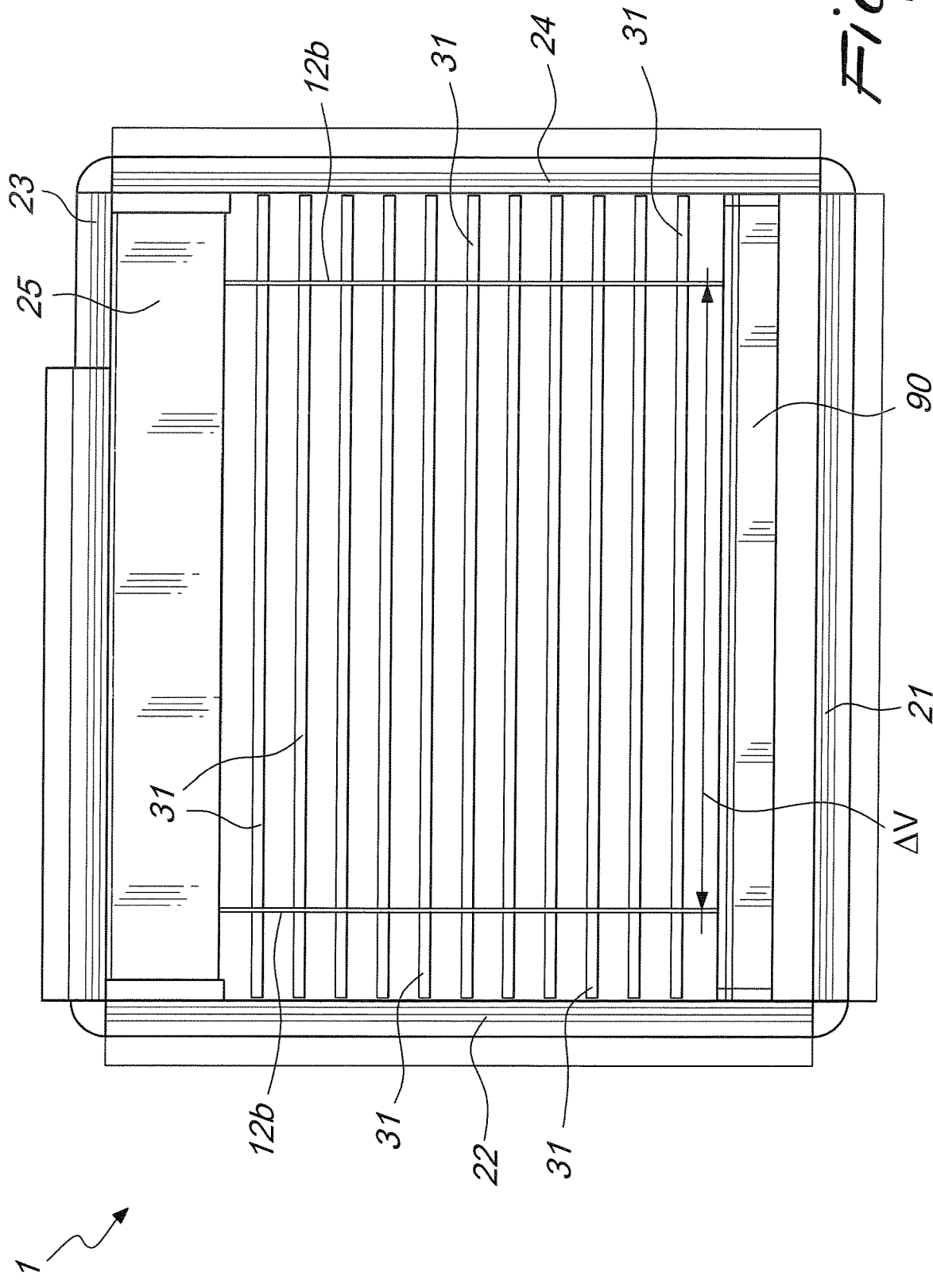
FIG. 10 is a schematic front view of part of a building-integrated photovoltaic apparatus, according to the disclosure.

In that way and as illustrated in FIG. 10, the working voltage ΔV in the photovoltaic slat 31 is defined by two second connection elements 12b.

In the preferred embodiment, in order to electrically connect the photovoltaic slats 31, the connection elements 12a, 12b comprise strips or cords which comprise conductive textiles.

Figure 5:
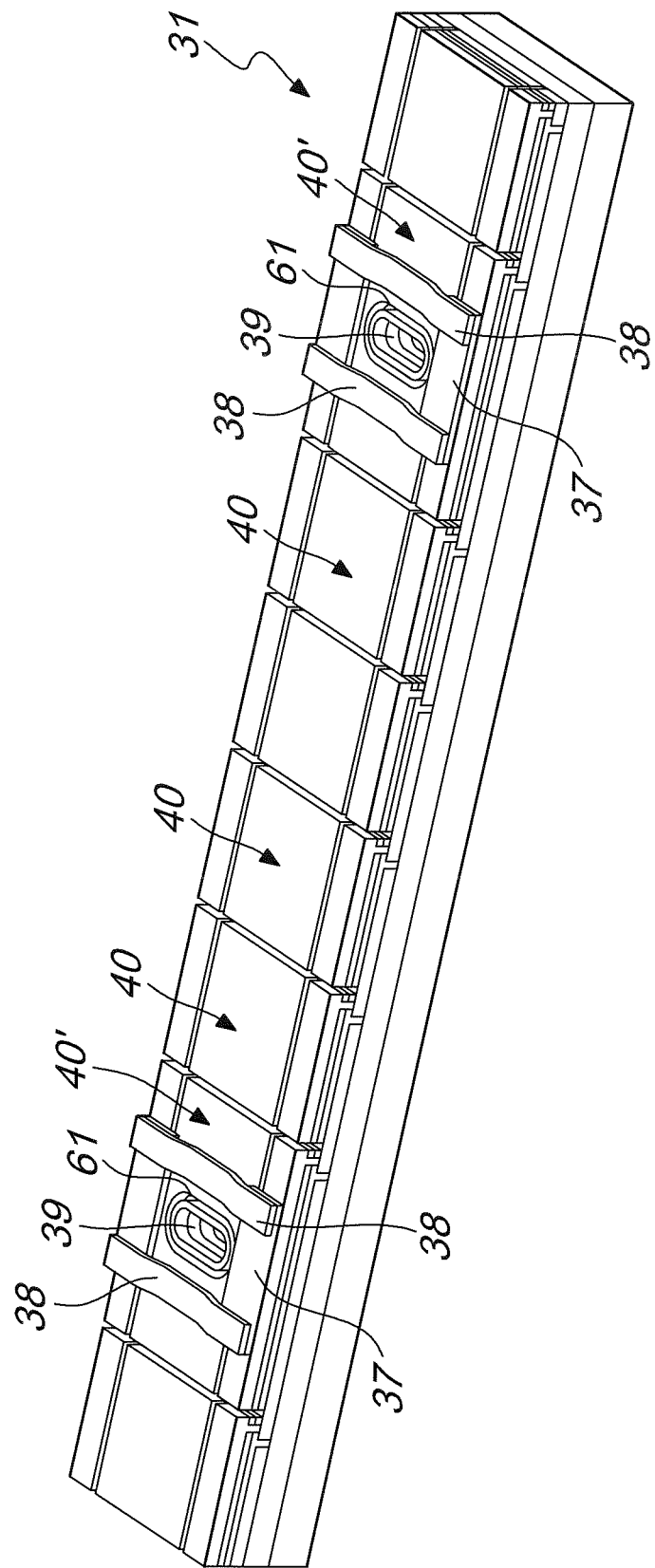
FIG. 5 is a schematic representation of the structure of a photovoltaic slat, according to the disclosure, provided with conductive flat ribbons.

In the example schematically illustrated in FIG. 5, the electrical connection devices, which electrically connected to the coupling thin film solar cells 40' to the second connection elements 12b, comprise conductive flat ribbons 38, preferably copper-based ribbon. Each one of the flat ribbons 38 is fixed and electrically connected to one coupling thin film solar cells 40' and electrically connected to a respective second connection element 12b (by direct contact or by interposed connection means) so as to connect each photovoltaic slat 31 with other photovoltaic slats 31 via the second connection elements 12b. The second connection elements 12b are then electrically connected to respective first connection elements 12a, which pass through the through holes 39, so that between the first connection elements 12a is there the same electric voltage ΔV (i.e. electrical potential difference) generated between the respective second connection elements 12a.

Preferably, two or four second connection elements 12b are electrically connected with the photovoltaic slats 31 along their longitudinal extension and each one of this two or four second connection elements 12b is electrically connected at one end with one respective first connection element 12a which, in turn, is electrically connected to a bypass diode or an electronic device—such as a DC to DC converter or power optimizer—and/or serially connected to a battery pack or an inverter which converts the variable direct current output into a synchronized alternating current that can be fed into a commercial electrical grid or used by an off-grid electrical network.

In the embodiment shown in FIG. 1, the apparatus 1 comprises two first connection elements 12a (i.e. conductive lifting cords), each one of which is electrically connected with two second connection elements 12b (i.e. conductive orientation cords). The electrical connection between the first connection elements 12a and the second connection elements 12b is realized, in a known way, inside the bottom rail 90.

In practice, in the preferred embodiment, the electric power is transmitted, with voltage ΔV, from the photovoltaic slats 31 to the second connection elements 12b, from the second connection elements 12b to the first connection elements 12a and to a bypass diode or an electronic device arranged in the top part of the frame (for example inside a box 25) and from the electronic device to a battery pack or an inverter which converts the variable direct current output into a synchronized alternating current that can be fed into a building's electrical grid.

In a different embodiment, the first connection elements 12a are electrically connected with the photovoltaic slats 31 and the second connection elements 12b are not.

Advantageously, the photovoltaic slats 31, 310 can be provided with a plurality of coupling thin film solar cells 40', and thus with a plurality of the through holes 39, placed at different distances, and then it is possible to electrically connect only some coupling thin film solar cells 40' with respective connection elements 12a, 12b, and so it is possible to choose the voltage ΔV of the photovoltaic slats 31, since the voltage ΔV depends on the number of thin film solar cells connected in serie, and therefore depends on the distance of the electrically connected coupling thin film solar cells 40'.

In that way, the connection elements 12a, 12b can be selectively arranged at different distances so as to allow customized working voltages such as 12V, 24V, 36V, 48V, etc., depending on the size of the blind 30.

FIG. 11 shows an example of a photovoltaic slat 31 provided with several coupling thin film solar cells 40'. In this illustrated example, three first connection elements 12a (i.e. three lifting cords) pass through three respective through holes 39 and can be selectively electrically connected each one with one or two respective second connection elements 12b (i.e. orientation cords) and preferably with one (or two) second connection element 12b that is electrically and mechanically connected to the same coupling thin film solar cells 40' through which the said first connection element 12a passes.

In this example, in practice, are there three possible tensions V1, V2, V3, selectable by selectively connecting two first connection elements 12a with two respective second connection elements 12b.

It should be noted that by connecting the second connection elements 12b to different coupling thin film solar cells 40' it is possible to provide diverse tensions V1, V2. V3.

In one embodiment the flat ribbons 38 and/or the connection elements 12b are provided with magnetic means (such as a magnet or the like) for maintaining the contact between the flat ribbons 38 and the connection elements 12b, so to ensure the electrical continuity.

In order to avoid any short-circuit or leakage current, an electrical insulator element 37 (shown in FIG. 5) is interposed between at least a portion of the connection device (i.e. of the conductive flat ribbons 38) and the photovoltaic slat 31 to which it is fixed, and more precisely at least between at least a portion of the conductive flat ribbons 38 and a portion of the coupling thin film solar cells 40'.

Preferably, the electrical insulator element 37 comprises an insulating layer made by inkjet printing or a self-adhesive tape.

Opportunely, the insulator element 37 is arranged in the boundary regions around the coupling thin film solar cells 40' to be electrically contacted by the flat ribbon 38.

In other embodiments (not shown), the connection devices comprise electrical conductive layer, such as metallic ink deposited by inkjet printing, deposited on the coupling single active devices 40'. In one particular embodiment, the connection devices comprise both the electrical conductive layer and the flat ribbons 38.

According to a feature in common to the various embodiments, the plurality of thin film solar cells 40, 40' comprise operational single thin film solar cells 40, which, in practice, are the thin film solar cells 40 not provided with through holes 39.

Advantageously, the operational thin film solar cells 40 and the coupling thin film solar cells 40' have a same active area.

It is useful to specify that the term "active area" is understood to reference the geometric area (i.e the geometric surface) which can be irradiated by the solar radiation and which contributes to generate electricity. In other words, the active area is the surface which is freely available to the incidence of sunlight and at the same time is electrically connected to the rest of the photovoltaic slat 31. Therefore the inactive areas defined by the close-pattern isolation grooves 61 and the areas covered by the connection devices (i.e. the flat ribbons 38 and/or the electrical conductive layer) and by the electrical insulating element 37 are not part of the active area.

Thus, the active area of a thin film solar cell 40, 40' can be defined by the following formula:

active area=(total area)−(inactive areas)−(areas covered by the connection devices and by the electrical insulating elements);

wherein the total area is the whole geometric surface of the thin film solar cell 40, 40'.

Thanks to this feature, the current flowing through each of the thin film solar cells 40, 40' is the same and not limited by the coupling thin film solar cells 40'.

It has also to be noted that, in the preferred embodiments, the photovoltaic slats 31 comprise an array, and more precisely a single line, of thin film solar cells 40, 40'.

Preferably, the apparatus 1 comprises an electronic device—such as a DC to DC converter or a power optimizer—configured to maximize the energy harvest from the photovoltaic slats 31.

Even more preferably, the apparatus 1 comprises a power optimizer configured to maximize the energy harvest from photovoltaic slats 31, such as the power optimizer described in R. Bruendlinger, N. Henze, G. Lauss, J. Liu, *Module integrated power converters—a comparison of state-of-the-art concept and performance test results*, 26th European Photovoltaic Solar Energy Conference and Exhibition, 2011,or in D. Gfeller, U. Muntwyler, C. Renken, L. Borgna, *Testing of smart PV modules*, 32nd European Photovoltaic Solar Energy Conference and Exhibition, 2016.

The apparatus 1 further comprises an electric motor configured to move the photovoltaic slats 31 (and/or the not-photovoltaic slats) by means of the connection elements 12a, 12b.

The electronic device (e.g. the power optimizer) and the electric motor are arranged inside the internal chamber 19, advantageously providing a very compact structure easy to be implemented in the windows.

Referring now in greater details to the spacer 20 that connects the panes 10A, 10B, it can comprise any suitable spacer known in the art, such as an extruded polymeric spacer or a frame made of assembled pieces (metallic and/or plastic).

In the preferred and illustrated embodiment, the spacer 20 comprises a quadrangular frame 20 comprising four channel-shaped pieces 21, 22, 23, 24 connected on the ends.

Figure 2:
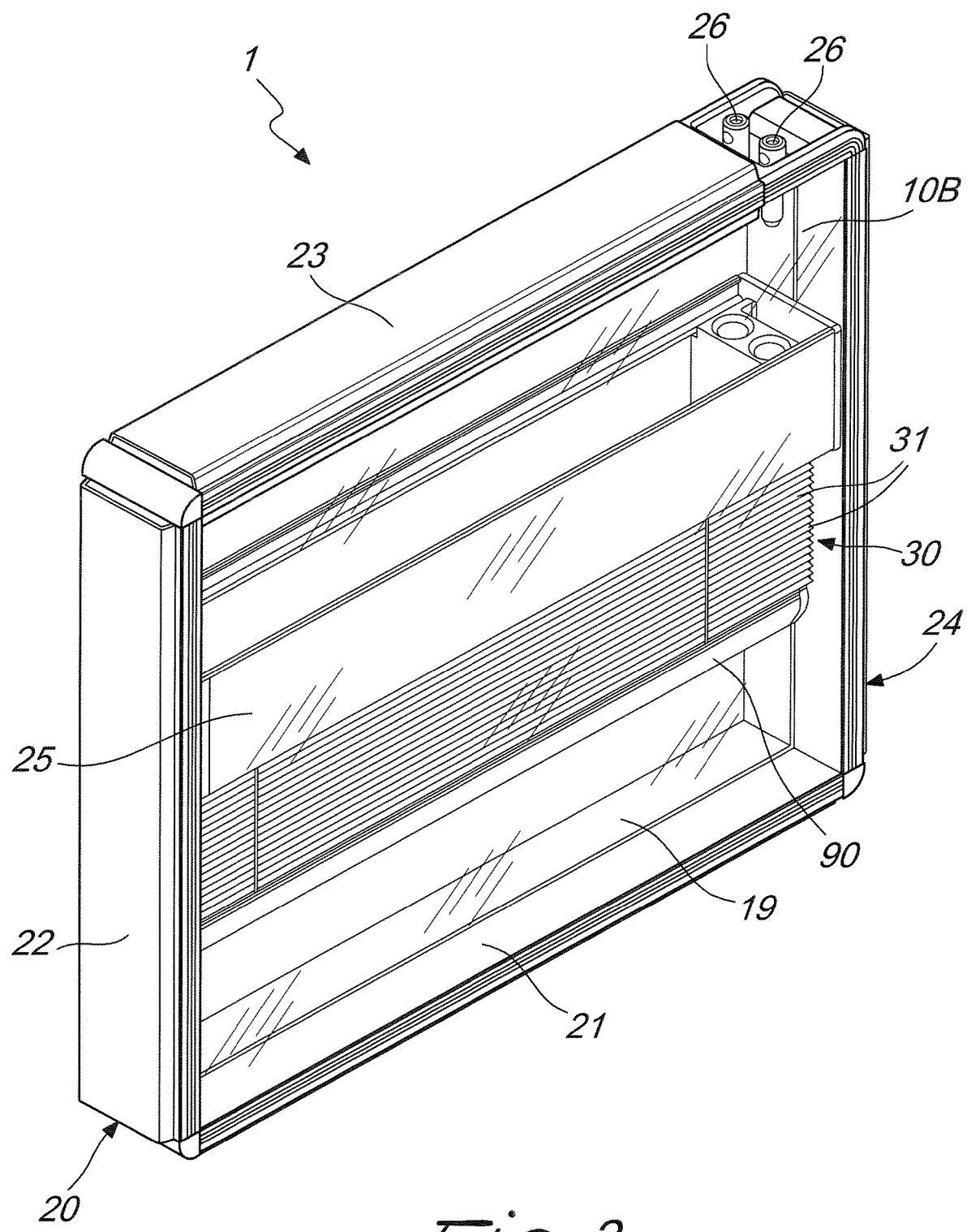
FIG. 2 is a prospective view of part of the apparatus of FIG. 1.

As shown in FIGS. 1, 2 and 10, a box 25 is enclosed within the quadrangular frame 20, between two opposite channel-shaped pieces 22, 24.

In this embodiment, the electronic device and the electric motor are arranged inside the box 25 and the photovoltaic slats 31 are supported by the box 25 by means of the connection elements 12a, 12b (i.e. the slats 31 are suspended from the box 25).

Further, the quadrangular frame 20 comprises one or more holes 26 for allowing the passage of connection wires from the box 25 to the outside of the internal chamber 19 for electric and/or data connection of the electric motor and the electronic device with other devices or circuits, such as a DC to AC converter, the building's electrical grid or a battery pack.

More precisely, the holes 26 pass through one of the channel-shaped pieces 23, preferably through the channel-shaped piece 23 placed on the top edge of the frame 20.

The apparatus 1 can further comprise control devices for controlling the motorized blind 30 from a wall switch or a keypad, or from a remote control, or from a computer, eliminating the need for cords and allowing control of otherwise inaccessible windows. This control provides ease-of-use and is effective for controlling the blind 30 operation to reduce building heat loss during winter or minimize heat from the sun during summer.

According to an optional and advantageous characteristic, at least one of the panes 10A, 10B is deposited on one face with a coating that reflects at least a portion of the spectrum of the solar radiation that is not converted into electric energy by the photovoltaic slats 31, so as to reduce the working temperature inside the internal chamber 19. Even more preferably the coating is configured to reflects the near infrared portion of the spectrum, from roughly 1.1 µm to onwards (where the solar cells do not convert the low energy photons into electric current but rise the temperature of the blind 30 above 90° C.) and so avoiding the related problems of reliability.

In some embodiments, the coating reflects also part of the spectrum of the solar radiation that could be converted into electric energy by the photovoltaic slats 31, in order to further reduce the working temperature inside the internal chamber 19.

For example, that coating can comprise an selective coating such as the selective coating describe in C G Granqvist, *Spectrally Selective Coatings for Energy Efficiency and Solar Applications* Phys. Scr. 32-401, 1985 or in J. Ebisawa and E. Ando, Solar control coating on glass, Solid State and Materials Science, Vol. 3, Issue 4, 386-390, 1998, or in R. J. Martin-Palma, *Spectrally selective coatings on glass: solar-control and low-emissivity coatings*, Journal of Nanophotonics, Vol. 3, 030305, 2009, or other selective coating known in the art.

In one embodiment, according to this optional feature, the panes 10A, 10B have the sides facing inside the internal chamber 19 treated for low emission by well-known processes involving suitable coatings able to make selective reflection in some parts of the solar spectrum.

The operation of the apparatus 1 is clear and evident from what has been described.

It should be noted that, thanks to its features, the apparatus 1 has a very compact structure. In particular, in the preferred embodiment, the whole apparatus 1, including the photovoltaic slats 31, motor, driver and all the mechanism for moving the photovoltaic slats 31 are arranged inside an internal chamber 19 of thickness of 12.7 mm, 15.9 mm, 25.4 mm up to 50.8 mm. Therefore, the apparatus 1 has a structure suitable to retrofit most of windows nowadays in the market.

The present disclosure relates also to a method for making a photovoltaic slat 31, 310 for an apparatus 1 of the type described above.

According to the disclosure, the method comprises the following steps:

a. providing a substrate 41, preferably a flexible substrate, and even more preferably metallic, such as a substrate made of aluminum (Al) or stainless steel (SS);

b. depositing on the substrate 41 at least one insulating layer 42, one back contact layer 43, a plurality of junction layers 44, 45 and a front contact layer 46 so as to form a photovoltaic sheet 131 and providing, within the back contact layer 43, the plurality of junction layers 44, 45 and the front contact layer 46, interconnection grooves 51, 52, 53 so as to define in the photovoltaic sheet 131 a plurality of thin film solar cells 40, 40' monolithically connected each other in series; among said plurality of thin film solar cells 40, 40' being defined at least two coupling thin film solar cells 40'; the insulating layer 42, the junction layers 44, 45 and the front contact layer 46, are, for example, of the types already described;

c. providing, in each coupling thin film solar cell 40', at least a close-pattern isolation groove 61 extending at least through the back contact layer 43, the plurality of junction layers 44, 45 and the front contact layer 46 so as to define an inactive area of the coupling thin film solar cell 40';

d. providing in each coupling thin film solar cell 40', within the inactive area, at least a through hole 39 passing through the substrate 41, the at least one insulating layer 42, the back contact layer 43, the plurality of junction layers 44, 45 and the front contact layer 46; said through hole 39 being adapted to allow the passage of a connection element 12a for the operative connection of the photovoltaic slat 31 with at least another photovoltaic slat 31; the through hole 39 can be drilled mechanically or by means of laser techniques.

Preferably, in the step b. at least a back contact layer, at least two junction layers and at least a front contact layer, such as a transparent conducting oxide layer (TCO), are deposited, in such a way that the junction layers define the required single p-n (or p-i-n) junctions or multi p-n (or p-i-n) junctions.

In greater detail, in one possible embodiment, wherein the single thin film solar cells 40, 40' are CIGS single junction solar cells, the step b., in turn, comprises the following steps:

b1. depositing at least one insulating layer 42 on the substrate 41;

b2. depositing a back contact layer 43 on the insulating layer 42;

b3. cutting the back contact layer 43 so as to provide first interconnection grooves 51, for example by laser scribing or by any other patterning techniques already mentioned;

b4. depositing a first junction layer 44, namely an absorber layer made of a semiconductor of the p-type, on the back metal contact layer 43 in such a way that the absorber layer 44 fills the first interconnection grooves 51;

b.5 depositing a second junction layer 45, namely a buffer layer made of a semiconductor of the n-type, on the first junction layer 44;

b6. cutting the second junction layer 45 and the first junction layer 44, so as to provide second interconnection grooves 52, for example by laser scribing or by any other patterning techniques already mentioned;

b7. depositing a front contact layer 46, namely a transparent conducting oxide layer, on the second junction layer 45 in such a way that the front contact layer 46 fills the second interconnection grooves 52;

b8. cutting the front contact layer 46, the second junction layer 45 and the first junction layer 44, so as to provide third interconnection grooves 53, for example by laser scribing or by any other patterning techniques already mentioned.

In a possible way for carrying out the method, in particular for realizing the slats 310 shown in FIGS. 9 and 10, the method further comprises, the following steps:

a step of providing in the photovoltaic sheet 131 one or more peripheral isolation grooves 62, 63 extending at least through the back contact layer 43, the plurality of junction layers 44, 45 and the front contact layer 46 so as to define one or more peripheral inactive areas 33, 320 of the photovoltaic sheet 131 and a step of bending and/or cutting the photovoltaic sheet 131, on said inactive an areas 33, 320, so as to form a photovoltaic slat 31, 310 of a suitable shape, for example cutting photovoltaic sheet 131 in substantially quadrangular pieces and then bending the peripheral inactive areas.

In the latter step, the photovoltaic sheet 131 can be bent along one or more of the peripheral isolation grooves 62, 63 so as to form a slat 310 with L-shaped or V-shaped cross section comprising two flat faces 320, 321 or to form a slat 31 comprising a central flat portion 32 placed between two bent portions 33.

At this point it is useful to specify that the term "photovoltaic sheet" used up to now is understood to reference in a fully general manner any photovoltaic sheet, leaf or film comprising a substrate 41, at least one insulating layer 42 arranged on the substrate 41, one back contact layer 43 arranged on said at least one insulating layer 42, a plurality of junction layers 44, 45 arranged on the back contact layer 43 and at least a front contact layer 46 arranged on said plurality of junction layers 44, 45 and wherein a plurality of thin film solar cells 40, 40' are defined.

It has to be noted that, in practice, in the preferred embodiments, the photovoltaics slats 31, 131 comprise a shaped photovoltaic sheet, i.e they include only a piece of photovoltaic sheet that has been eventually bent and drilled.

Preferably, the close-pattern isolation groove 61 and/or the open-pattern isolation grooves 62, 63 are provided during the step b. by aligning part of the interconnection grooves 51, 52, 53 (for instance by realizing some of the third interconnection groove 53 aligned on top to some first interconnection grooves 51).

The method according to the disclosure, in particular thanks to the close-pattern isolation groove 61, and also to the peripheral isolation grooves 62, 63, which insulate part of the photovoltaic sheet 131 before the mechanical processing, reduce the defects of the photovoltaic slats 31, 310.

In one embodiment of the present disclosure, ultrasonic welding is used to reduce the thermal stress in the previous process.

In practice it has been found that the integrated building photovoltaic apparatus and the method according to the present disclosure achieve the intended aim and objects, since they allow to have a more compact structure with dimensions smaller than the prior art and so it can replace or retrofit most of the windows nowadays in the market.

Another advantage of the apparatus, according to the disclosure, resides in that it avoids the problems due to the high temperature in the internal chamber.

A further advantage of the apparatus, according to the disclosure, resides in that it is more is more flexible and versatile in the design with respect to the prior art.

Another advantage of the apparatus according to the disclosure resides in that the assembly is easier with respect to the prior art.

Another advantage of the apparatus according to the disclosure resides in that it requires less maintenance with respect to the prior art. In the preferred embodiment, substantially no maintenance is required.

A further advantage of the apparatus and the method, according to the disclosure, resides in that mass production is easier and less costly with respect to the prior art.

Another advantage of the method according to the disclosure resides in that it avoids defects in the photovoltaic slats.

The integrated building photovoltaic apparatus and the method thus conceived are susceptible of numerous modifications and variations, all of which are within the scope of the inventive concept.

In practice, the materials used, so long as they are compatible with the specific use, as well as the contingent shapes and dimensions, may be any according to the requirements.

The invention claimed is:

1. An integrated building photovoltaic apparatus, suitable for closing an opening on a facade of a building and generating electricity from a solar radiation which pass through said opening, the apparatus comprising:
   a first pane and a second pane both at least partially transparent, and are joined to each other by an interposed spacer to form an internal chamber between them,
   a blind arranged inside said internal chamber and comprising a plurality of movable slats which comprise at least one photovoltaic slat and is configured to be moved to vary the amount of the solar radiation passing through the opening;
   connection elements, configured to pull or push said plurality of movable slats to make them translate along a first axis that is parallel to said panes or to rotate around second axes which are parallel to said panes and perpendicular to said first axis;
   wherein said at least one photovoltaic slat comprises a photovoltaic sheet comprising: a substrate, at least one insulating layer arranged on said substrate, a back contact layer arranged on said at least one insulating layer, a plurality of junction layers arranged on said back contact layer and at least a front contact layer arranged on said plurality of junction layers,
   the photovoltaic sheet comprising interconnection grooves which define in the photovoltaic sheet a plurality of solar cells monolithically connected to each other in series,
   said plurality of solar cells comprising at least two coupling solar cells, each one of which comprises:
      a through hole passing through the substrate, the at least one insulating layer, the back contact layer, the plurality of junction layers and the at least one front contact layer, and
      a close-pattern isolation groove surrounding the through hole and extending at least through said front contact layer, said plurality of junction layers and said back contact layer so as to define an inactive area of said coupling solar cell surrounding the through hole;
   said connection elements comprising first connection elements passing through said through holes.

2. The apparatus according to claim 1, wherein said movable slats comprise a plurality of photovoltaic slats.

3. The apparatus according to claim 1, wherein said plurality of solar cells comprises operational solar cells; said operational solar cells and said at least two coupling solar cells having a same active area.

4. The apparatus according to claim 1, wherein at least part of said connection elements comprise electrically conductive material and are configured to electrically and mechanically connect said photovoltaic slats; said at least part of said connection elements being electrically connected to said coupling solar cells by electrical connection devices.

5. The apparatus according to claim 4, wherein said connection elements comprise strips or cords which comprise conductive textiles.

6. The apparatus according to claim 4, wherein said electrical connection devices comprise:
   conductive flat ribbons each one being fixed and electrically connected to one of said coupling solar cells and electrically connected to one connection element to connect each photovoltaic slat with other photovoltaic slats via said connection elements
   or
   an electrical conductive layer deposited on the one of said coupling solar cells and electrically connected to one connection element so as to connect each photovoltaic slat with other photovoltaic slats via said connection elements.

7. The apparatus according to claim 4, further comprises an electrical insulating element interposed between at least a portion of said electrical connection device and the photovoltaic slat to which said electrical connection device is fixed.

8. The apparatus according to claim 1, wherein said photovoltaic slats comprise one or more peripheral isolation grooves extending at least through said front contact layer, said plurality of junction layers and said back contact layer to define one or more peripheral inactive areas of the photovoltaic slat.

9. The apparatus according to claim 8, wherein said peripheral inactive areas comprise at least one bent portion and said photovoltaic slats comprise a flat portion placed adjacent to said at least one bent portion; said peripheral isolation grooves being realized between said bent portion and the flat portion.

10. The apparatus according to claim 8, wherein said peripheral inactive areas comprise an inactive flat face and said photovoltaic slats comprise an active flat face; said inactive flat face and said active flat face being connected along a longitudinal edge; one of said peripheral isolation grooves being realized along said longitudinal edge.

11. The apparatus according to claim 1, further comprising a power optimizer and an electric motor configured to move at least one photovoltaic slat by said connection elements; said power optimizer and said electric motor being arranged inside said internal chamber.

12. The apparatus according to claim 1, wherein at least one of said panes is deposited on one face with a coating that reflects at least a portion of the spectrum of the solar radiation that is not converted into electric energy by the photovoltaic slats so as to reduce the working temperature inside the internal chamber.

13. A method for making a photovoltaic slat for an integrated building photovoltaic apparatus configured for closing an opening on a facade of a building and generating electricity from a solar radiation which pass through said opening and comprising a blind arranged inside an internal chamber defined between two at least partially transparent panes and which comprise a plurality of movable photovoltaic slats, the method including the following steps:
 a. providing a substrate,
 b. depositing on said substrate at least one insulating layer, one back contact layer, a plurality of junction layers and a front contact layer, to form a photovoltaic sheet and providing, within said back contact layer, said plurality of junction layers and said front contact layer, interconnection grooves, to define in the photovoltaic sheet a plurality of solar cells monolithically connected to each other in series; among said plurality of solar cells being defined at least two coupling solar cells,
 c. providing, in each coupling solar cell, at least a close-pattern isolation groove extending at least through said back contact layer, said plurality of junction layers and said front contact layer so as to define an inactive area of the coupling solar cell, and
 d. providing in each coupling solar cell, within said inactive area, at least a through hole passing through said substrate, said at least one insulating layer, said back contact layer, said plurality of junction layers and said front contact layer; said through hole being adapted to allow the passage of a connection element for the operative connection of said photovoltaic slat with at least another photovoltaic slat.

14. The method according to claim 13, further including the following steps:
 providing in said photovoltaic sheet one or more peripheral isolation grooves extending at least through said back contact layer, said plurality of junction layers and said front contact layer so as to define one or more peripheral inactive areas of the photovoltaic sheet, and
 bending or cutting said photovoltaic sheet, on said one or more peripheral inactive areas, to form a photovoltaic slat.

15. The method according to claim 14, wherein said close-pattern isolation groove or peripheral isolation grooves are provided during the step b. by aligning part of said interconnection grooves.

16. A photovoltaic slat for an integrated building photovoltaic apparatus suitable for closing an opening on a facade of a building and generating electricity from a solar radiation which pass through said opening and comprising a blind which is arranged inside an internal chamber defined between two at least partially transparent panes and which comprise a plurality of movable photovoltaic slats,
 said photovoltaic slat comprising a photovoltaic sheet comprising: a substrate, at least one insulating layer arranged on said substrate, one back contact layer arranged on said at least one insulating layer, a plurality of junction layers arranged on said back contact layer and at least a front contact layer arranged on said plurality of junction layers,
 the photovoltaic sheet comprising interconnection grooves which define in the photovoltaic sheet a plurality of solar cells monolithically connected to each other in series,
 said plurality of solar cells comprising at least two coupling solar cells, each one of which comprises:
  a through hole passing through the substrate, the at least one insulating layer, the back contact layer, the plurality of junction layers and the at least one front contact layer, and
  a close-pattern isolation groove surrounding the through hole and extending at least through said front contact layer, said plurality of junction layers and said back contact layer so as to define an inactive area of said coupling solar cell surrounding the through hole;
 said through hole being adapted to allow the passage of a connection element for the operative connection of said photovoltaic slat with at least another photovoltaic slat.

\* \* \* \* \*